United States Patent
Xu et al.

(10) Patent No.: US 10,468,074 B2
(45) Date of Patent: Nov. 5, 2019

(54) METHODS FOR GENERATING REFERENCE VOLTAGES AND CONTROLLERS UTILIZING THE SAME

(71) Applicant: Shanghai Zhaoxin Semiconductor Co., Ltd., Shanghai (CN)

(72) Inventors: Minglu Xu, Beijing (CN); Fan Jiang, Beijing (CN); Jiajia Xia, Beijing (CN)

(73) Assignee: SHANGHAI ZHAOXIN SEMICONDUCTOR CO., LTD., Shanghai (CN)

(*) Notice: Subject to any disclaimer, the term of this patent is extended or adjusted under 35 U.S.C. 154(b) by 0 days.

(21) Appl. No.: 15/813,515

(22) Filed: Nov. 15, 2017

(65) Prior Publication Data

US 2019/0005989 A1  Jan. 3, 2019

(30) Foreign Application Priority Data

Jun. 30, 2017  (CN) .......................... 2017 1 0523736

(51) Int. Cl.

| G11C 5/14 | (2006.01) |
|---|---|
| G05F 1/625 | (2006.01) |
| G11C 16/24 | (2006.01) |
| G11C 8/12 | (2006.01) |
| G11C 16/12 | (2006.01) |

(Continued)

(52) U.S. Cl.
CPC .............. *G11C 5/147* (2013.01); *G05F 1/625* (2013.01); *G11C 7/12* (2013.01); *G11C 8/12* (2013.01); *G11C 16/12* (2013.01); *G11C 16/24* (2013.01); *G11C 7/1048* (2013.01)

(58) Field of Classification Search
CPC ................................ G11C 5/147; G05F 1/625
See application file for complete search history.

(56) References Cited

U.S. PATENT DOCUMENTS

| 4,999,807 A | 3/1991 | Akashi |
| 5,796,296 A | 8/1998 | Krzentz |

(Continued)

FOREIGN PATENT DOCUMENTS

| CN | 105321541 A | 2/2016 |
| CN | 105321577 A | 2/2016 |

(Continued)

OTHER PUBLICATIONS

CN Office Action dated Apr. 28, 2018 in corresponding Chinese application (No. 201710523736.0).

(Continued)

*Primary Examiner* — Uyen B Tran
(74) *Attorney, Agent, or Firm* — McClure, Qualey & Rodack, LLP (57) ABSTRACT

A controller includes an input/output circuit and a reference voltage generating circuit. The input/output circuit includes a plurality of receiving circuits. Each receiving circuit receives and processes one data bit and generates an output bit accordingly. The reference voltage generating circuit is coupled to the input/output circuit and includes a plurality of circuit units for providing a plurality of reference voltages. One of the circuit units is coupled to one of the receiving circuits to provide a reference voltage to the corresponding receiving circuit and the receiving circuit processes the data bit according to the received reference voltage.

14 Claims, 8 Drawing Sheets

(51) Int. Cl.
  *G11C 7/12* (2006.01)
  *G11C 7/10* (2006.01)

(56) References Cited

U.S. PATENT DOCUMENTS

| | | | |
|---|---|---|---|
| 7,167,039 B2 | 1/2007 | Garrett, Jr. et al. | |
| 7,230,449 B2 | 6/2007 | Dreps et al. | |
| 7,974,141 B2 | 7/2011 | Fox et al. | |
| 8,390,352 B2 | 3/2013 | Seefeldt et al. | |
| 9,418,726 B1 | 8/2016 | Sun | |
| 9,536,594 B1 | 1/2017 | Sun | |
| 2004/0170067 A1* | 9/2004 | Kashiwazaki | G11C 5/14 365/189.09 |
| 2005/0104624 A1 | 5/2005 | Zumkehr et al. | |
| 2008/0303504 A1* | 12/2008 | Kang | G05F 3/30 323/313 |
| 2010/0188140 A1* | 7/2010 | Smeloy | G11C 5/147 327/538 |
| 2017/0154653 A1* | 6/2017 | Sun | G11C 7/1084 |
| 2017/0154669 A1 | 6/2017 | Sun | |
| 2018/0076829 A1* | 3/2018 | Ueki | G06F 11/073 |
| 2018/0122435 A1* | 5/2018 | Kim | G11C 5/147 |

FOREIGN PATENT DOCUMENTS

| | | |
|---|---|---|
| CN | 105469817 A | 4/2016 |
| CN | 105489235 A | 4/2016 |
| JP | 63182729 A | 7/1988 |
| JP | 2504018 B2 | 4/1996 |

OTHER PUBLICATIONS

TW Office Action dated May 21, 2018 in Taiwan application (No. 106140078).

\* cited by examiner

METHODS FOR GENERATING REFERENCE VOLTAGES AND CONTROLLERS UTILIZING THE SAME

CROSS REFERENCE TO RELATED APPLICATIONS

This Application claims priority of China Patent Application No. 201710523736.0, filed on Jun. 30, 2017, the entirety of which is incorporated by reference herein.

BACKGROUND OF THE INVENTION

Field of the Invention

The invention relates to a controller, and more particularly to a memory controller capable of providing an individual reference voltage for each bit.

Description of the Related Art

In existing computer systems, the physical interface of Double Data Rate Synchronous Dynamic Random Access Memory (DDR SDRAM) is a standard protocol specification defined for connecting the memory controller to the memory devices, including the DDR1, DDR2, DDR3, DDR4 and so on. This protocol defines all the signals, the relationship and the timing between the signals, and how the signal transmission goes between memory and memory controller via this interface.

Using existing technology, the memory controller first gives the address signal through the address bus pins, and then selectively provides the read/write control signal through the control pins. The address signal and the read/write control signal enter the physical layer via the physical layer interface, and the receiver in the DDR physical layer receives the data signal from the memory controller or returns the data signal read from the memory according to the read/write control signals.

When reading data from the memory device, the memory controller must sample the data signal according to the clock signal to obtain the content of the data. Therefore, how to accurately sample the data read from the memory is a key factor affecting the performance of the memory controller product.

BRIEF SUMMARY OF THE INVENTION

A controller and methods for generating reference voltages are provided. An exemplary embodiment of a controller comprises an input/output circuit and a reference voltage generating circuit. The input/output circuit comprises a plurality of receiving circuits. Each receiving circuit receives and processes one data bit and generates an output bit accordingly. The reference voltage generating circuit is coupled to the input/output circuit and includes a plurality of circuit units for providing a plurality of reference voltages. One of the circuit units is coupled to one of the receiving circuits to provide a reference voltage to the corresponding receiving circuit and the receiving circuit processes the data bit according to the received reference voltage.

An exemplary embodiment of a method for generating reference voltages, suitable for a controller, wherein the controller comprises an input/output circuit and a reference voltage generating circuit, the input/output circuit comprises a plurality of receiving circuits configured to receive and process a plurality of data bits and the reference voltage generating circuit comprises a plurality of circuit units, the method comprises: providing a reference voltage to a corresponding receiving circuit by each circuit unit; and processing one of the plurality of data bits by each receiving circuit according to the corresponding reference voltage to generate an output bit.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
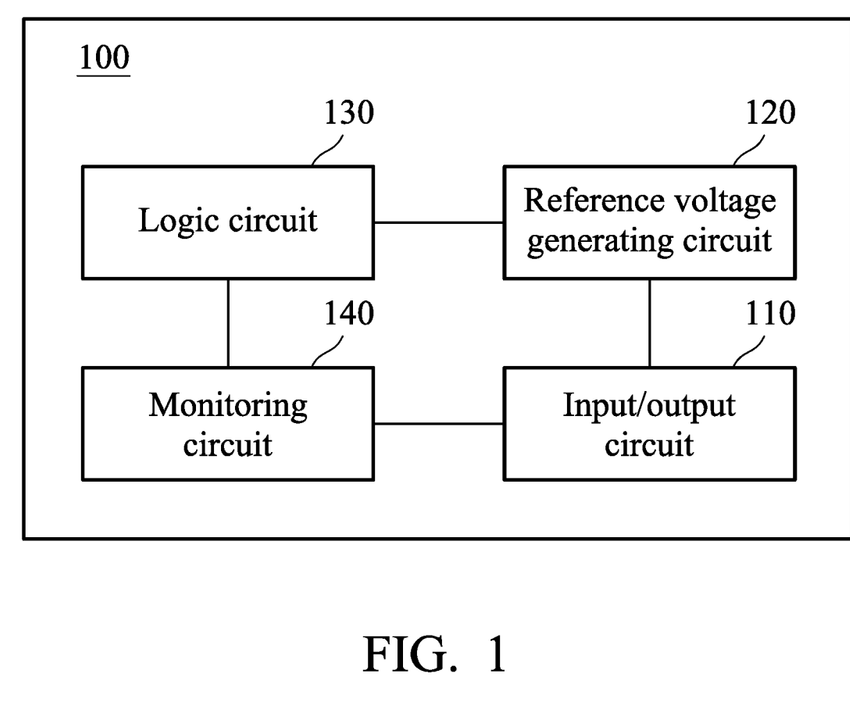
FIG. 1 is an exemplary block diagram of a controller according to an embodiment of the invention.

FIG. 1 is an exemplary block diagram of a controller according to an embodiment of the invention. According to an embodiment of the invention, the controller 100 may be a memory controller or a controller chip, such as a DDR controller for controlling operations of the DDR.

The controller 100 may at least comprise an input/output circuit 110, a reference voltage generating circuit 120, a logic circuit 130 and a monitoring circuit 140. Note that in order to clarify the concept of the invention, FIG. 1 presents a simplified block diagram, in which only the elements relevant to the invention are shown. However, the controller 100 may further comprise any other components not shown in the figures. Therefore, the invention should not be limited what is shown in FIG. 1.

Generally, the controller 100 may receive data from an external memory device and/or transmit data to the external memory device via at least one channel. One channel may be configured to transmit eight bytes of data, and each byte of data comprises eight bits of data.

According to an embodiment of the invention, the input/output circuit 110 may comprise a plurality of receiving circuits (not shown in FIG. 1), wherein each receiving circuit receives and processes one bit of data (one data bit) and generates an output bit according to the data bit.

According to an embodiment of the invention, the reference voltage generating circuit 120 is coupled to the input/output circuit 110 and the reference voltage generating circuit 120 comprises a plurality of circuit units for providing a plurality of reference voltages. Noted that according to an embodiment of the invention, the reference voltage generating circuit 120 may provide individual reference voltage to each receiving circuit. Therefore, in one embodiment of the invention, each receiving circuit may receive the corresponding reference voltage from different circuit units and process the data bit according to the received reference voltage to generate a corresponding output bit accordingly. In other words, in one embodiment of the invention, the reference voltage can be independently generated, controlled and adjusted for each bit. A more detailed description will be provided in the following paragraphs.

The logic circuit 130 is coupled to the reference voltage generating circuit 120 and is configured to control the operations of the circuit units. According to an embodiment of the invention, the circuit units are controlled independently, such that the reference voltage generating circuit generates a plurality of reference voltages having the same or different voltage levels.

The monitoring circuit 140 is coupled to the input/output circuit 110 and is configured to monitor the output bit generated by each receiving circuit in a voltage calibration procedure.

The monitoring circuit 140 is further coupled to the logic circuit 130 and is configured to feedback the result of monitoring the output bit generated by each receiving circuit to the logic circuit 130 as the basis for the logic circuit 130 to further control the operations of the circuit units in the reference voltage generating circuit 120.

Figure 2:
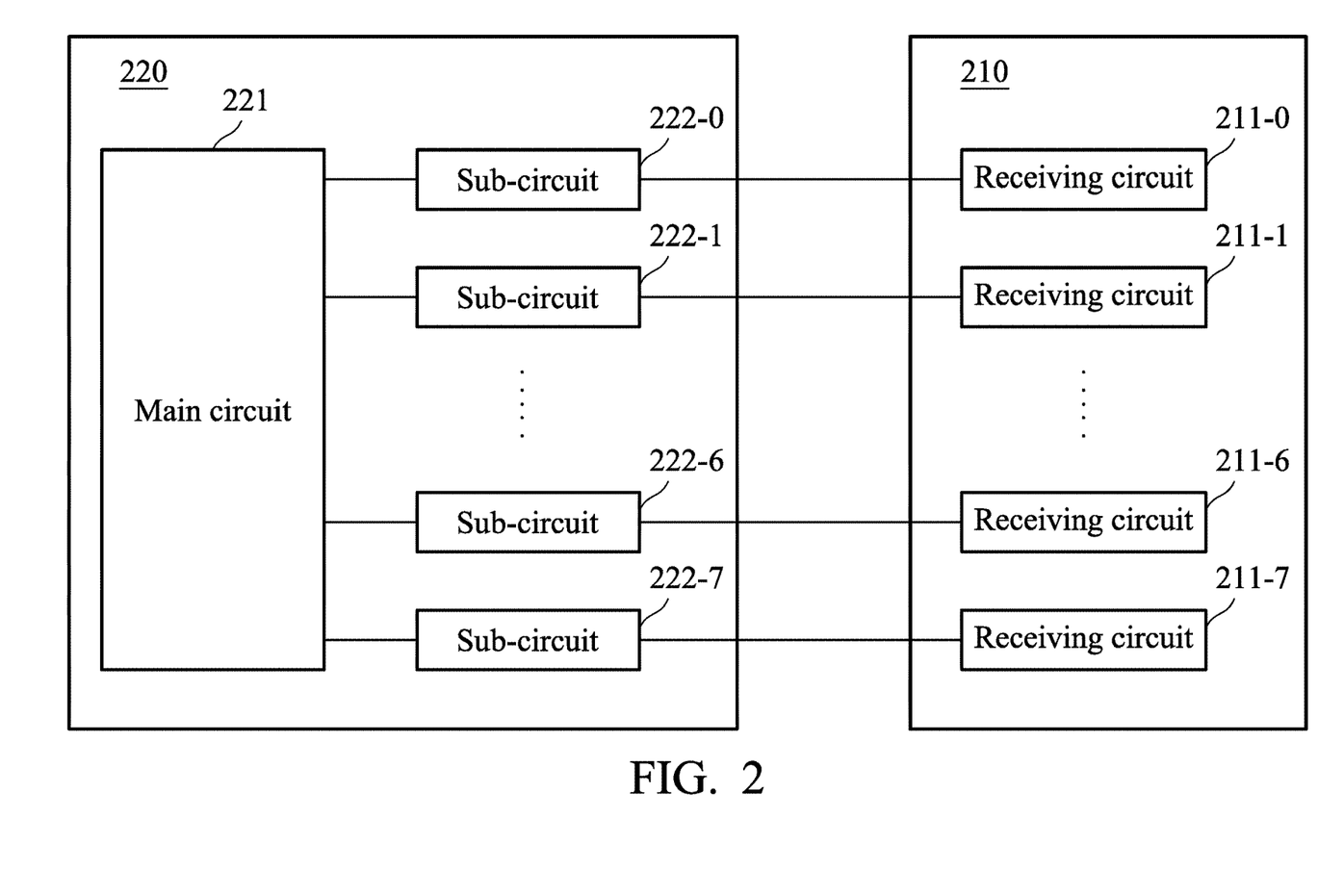
FIG. 2 is a circuit schematic of the input/output circuit and the reference voltage generating circuit according to an embodiment of the invention.

FIG. 2 is a schematic circuit diagram of the input/output circuit and the reference voltage generating circuit according to an embodiment of the invention. The input/output circuit 210 may comprise a plurality of receiving circuits, such as the receiving circuits 211-0, 211-1 . . . 211-6 and 211-7. The reference voltage generating circuit 220 may comprise a main circuit 221 and a plurality of sub-circuits, such as the sub-circuits 222-0, 222-1 . . . 222-6 and 222-7. According to an embodiment of the invention, the main circuit 221 and one of the plurality of sub-circuits may form one circuit unit. A circuit unit may correspond to a receiving circuit, for providing the corresponding reference voltage to the corresponding receiving circuit.

As shown in FIG. 2, the sub-circuits 222-0, 222-1 . . . 222-6 and 222-7 are coupled to the receiving circuits 211-0, 211-1 . . . 211-6 and 211-7 respectively, and the sub-circuits 222-0, 222-1 . . . 222-6 and 222-7 are configured to provide the reference voltage generated thereby to the corresponding receiving circuit and make the receiving circuit process the data bit according to the received reference voltage.

According to an embodiment of the invention, the main circuit may be coupled to the system high voltage VDD and the ground voltage GND, and is configured to generate a high voltage and a low voltage according to the system high voltage VDD and the ground voltage GND and provide the high voltage and the low voltage to the sub-circuits. Each sub-circuit is configured to generate the corresponding reference voltage according to the high voltage and the low voltage.

The main circuit and the sub-circuit may respectively comprise a plurality of active devices and/or passive devices, and at least one switching device, wherein the devices may be equivalent to a resistor string. By controlling the switching device, the voltage level of the output reference voltage can be adjusted.

Note that in order to clarify the concept of the invention, FIG. 2 presents an exemplary circuit diagram of the input/output circuit and the reference voltage generating circuit for processing one byte of data. However, it should be understood that the number of receiving circuits and circuit units should not be limited to the exemplary circuit diagram shown in FIG. 2. As discussed above, the number of receiving circuits and circuit units may be determined according to the number of channels required.

Figure 3:
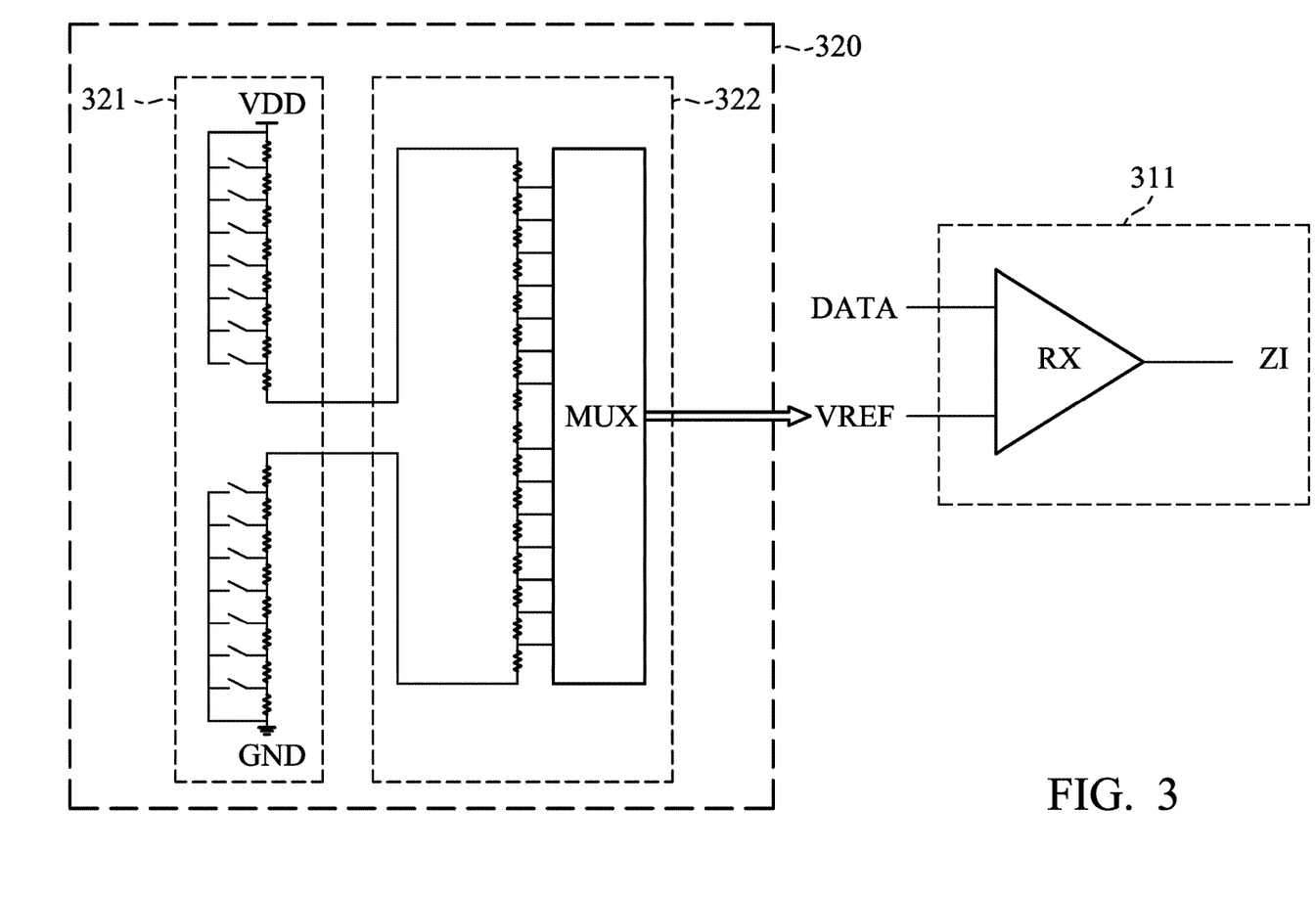
FIG. 3 shows an equivalent circuit diagram of a receiving circuit and a circuit unit according to an embodiment of the invention.

FIG. 3 shows an equivalent circuit diagram of a receiving circuit and a circuit unit according to an embodiment of the invention. As shown in FIG. 3, the circuit unit 320 may comprise a main circuit 321 and a sub-circuit 322. As discussed above, the main circuit 321 may comprise a plurality of active devices and/or passive devices, and at least one switching device. As discussed above, the sub-circuit 322 may also comprise a plurality of active devices and/or passive devices. Since the active devices and/or passive devices may be equivalent to a resistor string, in the equivalent circuit diagram shown in FIG. 3, the main circuit 321 and the sub-circuit 322 may respectively equivalent to comprise at least one resistor string.

As shown in FIG. 3, the sub-circuit 322 may comprise a multiplexer MUX. The logic circuit 130 may control the on-off status of each switching device in the main circuit 321 of the circuit unit 320, and control the multiplexer MUX in the sub-circuit 322 of the circuit unit 320 to set the output of the sub-circuit 322 to the reference voltage VREF which is on an optimum voltage level. According to an embodiment of the invention, the optimum voltage level is the voltage level of the reference voltage VREF for the corresponding receiving circuit 311 to have the maximum operating range or the minimum error rate.

As shown in FIG. 3, the receiving circuit 311 may comprise a processing circuit RX, to process the data bit DATA according to the received reference voltage VREF, to generate the output bit ZI. Since the voltage level of the reference voltage VREF has been set to the corresponding optimum voltage level in the voltage calibration procedure, the performance and accuracy of the receiving circuit can be greatly improved. The voltage calibration procedure will be introduced in more detail in the following paragraphs.

Figure 4:
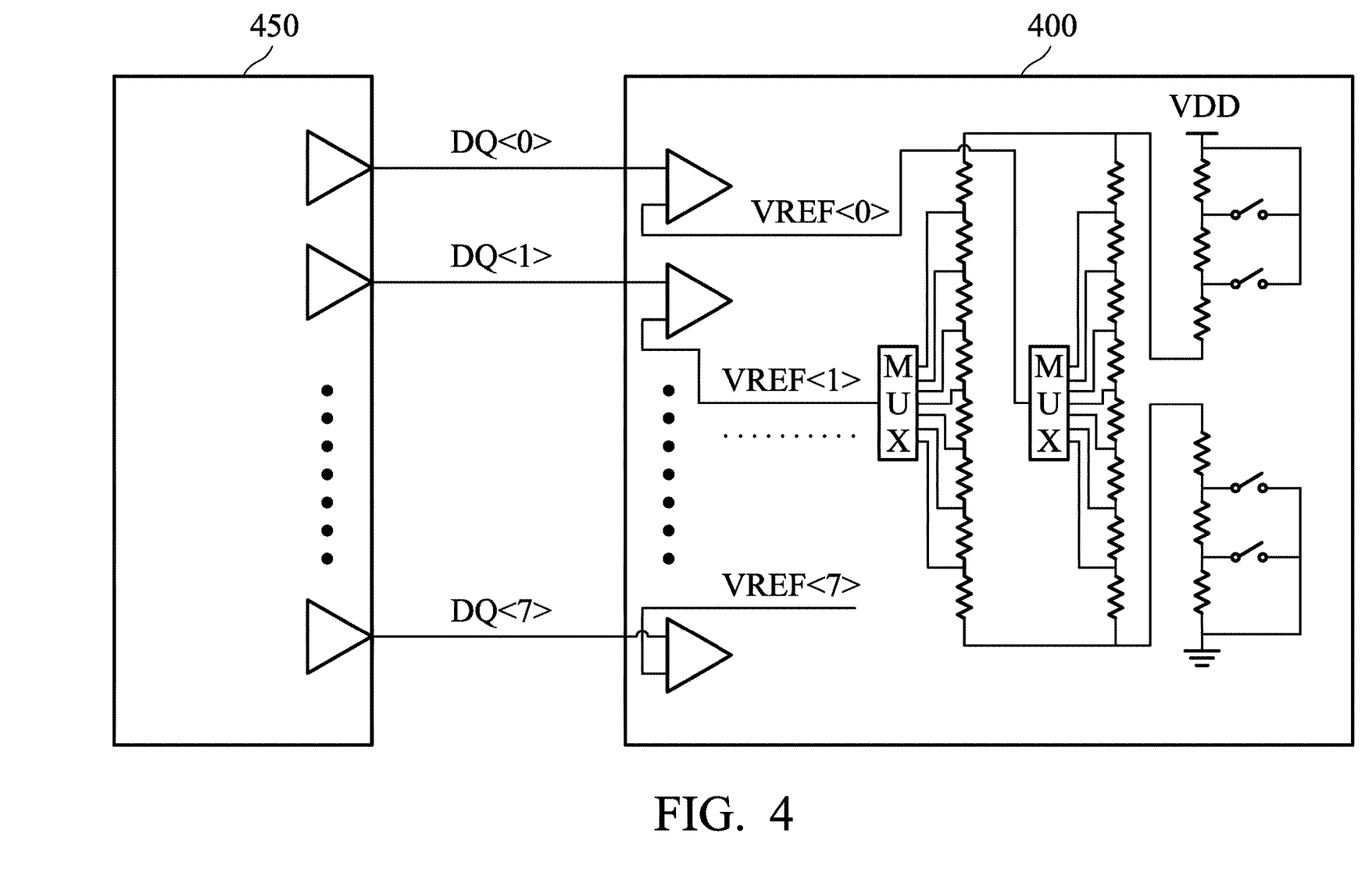
FIG. 4 shows an exemplary schematic diagram of a controller and an external memory device according to an embodiment of the invention.

FIG. 4 shows an exemplary schematic diagram of a controller and an external memory device according to an embodiment of the invention. For simplicity, only a portion of the input/output circuit and the reference voltage generating circuit are shown in the controller 400. As shown in FIG. 4, the input/output circuit of the controller 400 receives one byte of data, including eight data bits DQ<0>, DQ<1> . . . DQ<7>, from the transmitter of the external memory device 450. The reference voltage generating circuit may generate the corresponding reference voltages VREF<0>, VREF<1> . . . VREF<7> for each receiving circuit. In this manner, each receiving circuit may process the received data bit according to the individual reference voltage.

Figure 5:
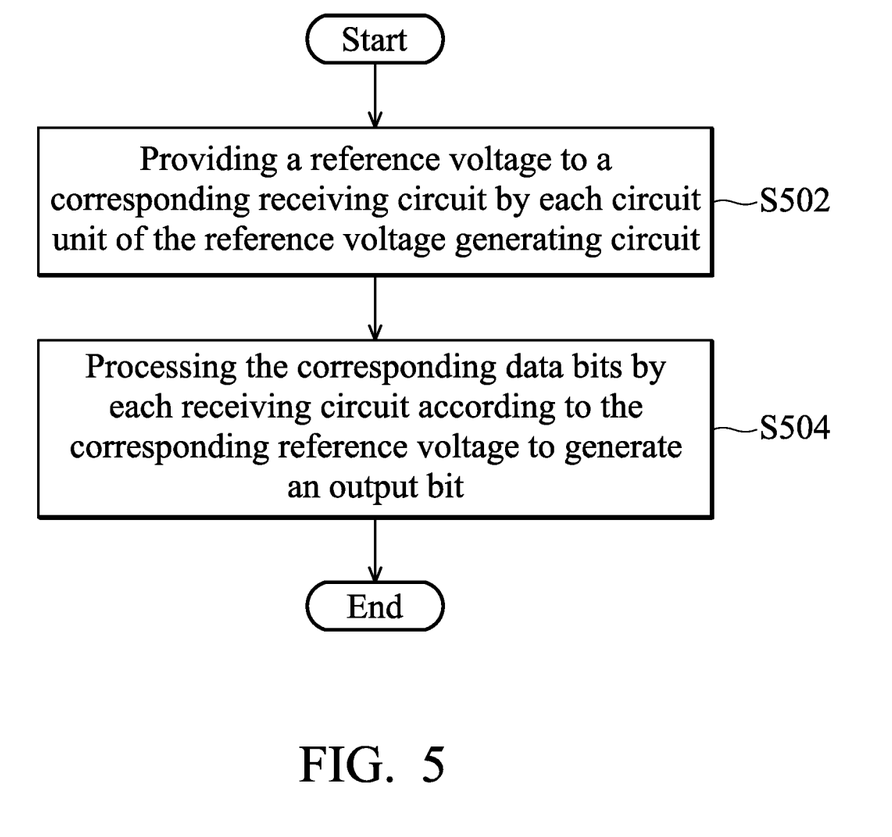
FIG. 5 shows an exemplary flow chart of a method for generating the reference voltage according to an embodiment of the invention.

FIG. 5 shows an exemplary flow chart of a method for generating the reference voltage according to an embodiment of the invention. The flow chart is suitable for the controller as shown in FIG. 1-FIG. 4. First of all, a reference voltage is provided to a corresponding receiving circuit by each circuit unit of the reference voltage generating circuit (Step S502). Next, the corresponding data bit is processed by each receiving circuit according to the corresponding reference voltage to generate an output bit (Step S504).

According to an embodiment of the invention, when the controller powers up, a voltage calibration procedure may be performed first to find out the optimum voltage level of the reference voltage VREF for each receiving circuit. After the optimum voltage level is obtained, the logic circuit 130 may control each circuit unit according to the corresponding optimum voltage level, so as to set the voltage level of the reference voltage generated by each circuit unit as the corresponding optimum voltage level.

Figure 6:
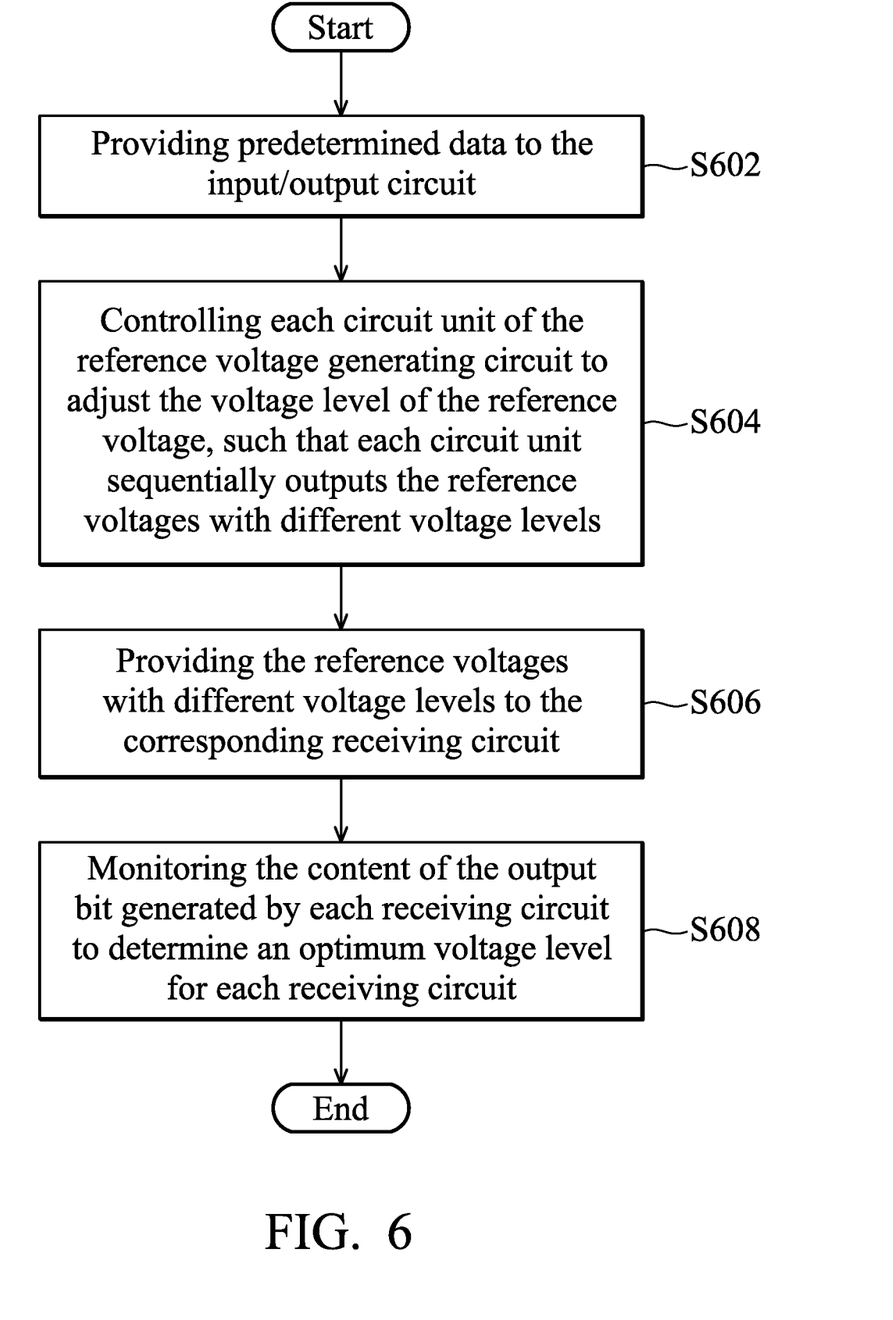
FIG. 6 shows an exemplary flow chart of a method for calibrating voltage according to an embodiment of the invention.

FIG. 6 shows an exemplary flow chart of a method for calibrating voltage according to an embodiment of the invention. In the voltage calibration procedure, the logic circuit 130 or the monitoring circuit 140 may provide predetermined data to the input/output circuit (Step S602). The content of the predetermined data is known. For example, the predetermined data may be a specific test pulse, and may comprise a plurality of data bits. Each receiving circuit of the input/output circuit 110 may be configured to receive each data bit corresponding to the predetermined data. Next, the logic circuit 130 may control each circuit unit of the reference voltage generating circuit 120 to adjust the voltage level of the reference voltage, then the circuit units output the reference voltages with different voltage levels in sequence (Step S604). For example, each circuit unit may gradually increase the voltage level of the reference voltage from the ground voltage GND to the system high voltage VDD based on a predetermined step (for example, 5 mV).

Next, the circuit units of the reference voltage generating circuit 120 may provide the reference voltages with different voltage levels to the corresponding receiving circuits of the input/output circuit 110 in sequence (Step S606). In this manner, the receiving circuits of the input/output circuit 110 may process the data bits according to the reference voltages with different voltage levels, sequentially. Finally, the monitoring circuit 140 may monitor the content of each output bit generated by each receiving circuit to determine an optimum voltage level for each receiving circuit (Step S6008).

For example, in step S608, the monitoring circuit 140 may monitor the content of the output bit generated by each receiving circuit of the input/output circuit 110 in a period of time. As an example, the monitoring circuit 140 may sample the content of the output bit at multiple points of the period of time according to a predetermined time span (such as, every 7 ps), and record the sampled content in a table. The table may be an array for recording the content of the output bit generated by each receiving circuit of the input/output circuit 110 at multiple points of the period of time according to different voltage levels of reference voltages. When the content of the output bit matches the content of the predetermined data, it means that at the corresponding voltage level, the receiving circuit can successfully receive and sample (or process) the data bit. When the content of the output bit does not match the content of the predetermined data, it means that at the corresponding voltage level, the receiving circuit cannot successfully receive and sample (or process) the data bit.

After finishing recording the sampled content, the monitoring circuit 140 may find out the voltage level of the reference voltage which make the receiving circuit have the maximum operating range. The maximum operating range is that under the same conditions (for example, the same length of the period of time and the same data content), the number of data bit that can be successfully received and sampled (or processed) by the receiving circuit can be the maximum value among the others. In other words, the monitoring circuit 140 may find out the voltage level of the reference voltage which make the output bit of the receiving circuit have the minimum error rate, or can the eye diagram of the output bit have the widest time span.

After determining the optimum voltage level for each receiving circuit, the monitoring circuit 140, which is coupled to the logic circuit 130, may feed the determined optimum voltage level back to the logic circuit 130. The logic circuit 130 may apply the optimum voltage level on the corresponding circuit units of the reference voltage generating circuit, and set the voltage level of the reference voltage generated by each circuit unit to the corresponding optimum voltage level.

Note that in the embodiment of the invention, the voltage level of the reference voltage can be controlled and adjusted per bit. Therefore, the receiving circuit utilized for processing different bits may receive the reference voltages with different (or the same) voltage levels, and may process the corresponding data bit according to the reference voltages with different (or the same) voltage levels.

In addition, noted that in the conventional controller design, the circuit for providing the reference voltage is disposed outside of the chip. For example, the circuit for providing the reference voltage is disposed between the controller 400 and the memory device 450 shown in FIG. 4, and is disposed outside of the controller chip. However, this kind of design not only increases the cost of materials and the cost of packaging, but it also requires additional pins in the controller chip to receive the reference voltage. In addition, in the conventional controller design, noise on the printed circuit board can easily be introduced into the controller chip. In contrast to the conventional design, in the embodiment of the invention, the reference voltage generating circuit is disposed inside of the controller chip, which effectively overcomes the disadvantages of the conventional design where the circuit is disposed outside the chip.

In addition, it is worth noting that in a conventional controller design, input/output circuits for processing one byte of data typically share the same reference voltage. However, due to the presence of manufacturing errors, there must be some differences in the reference voltage required for each bit in one byte. If the same reference voltage is shared, the skew of each output bit is increased. In contrast to the conventional design, in the embodiment of the invention, the voltage level of each reference voltage is controlled and adjusted per bit. Therefore, the receiving circuits for processing different bits may receive reference voltages having different (or the same) voltage levels and may process the corresponding data bits according to the reference voltages having different (or the same) voltage levels. In this manner, the skew of the output bits can be effectively reduced.

In addition, since the requirement of the transmission speed of the memory device is continuously increased, i.e., the system high voltage is required to be reduced, the transmission time of each data bit becomes shorter and the accuracy of the voltage regulation must be finer than ever. To fulfill such requirement, in the embodiments of the invention, each input/output circuit of each bit is provided with an independent circuit unit which supplies a reference voltage, and the logic circuit 130 controls each circuit unit. In this manner, not only the skew of the output bit can be effectively reduced, but also the accuracy of voltage regulation can be improved, which is in line with the needs of memory technology in the recent years.

In addition, compared to the conventional design, the proposed controller has the advantages of smaller circuit area and lower power consumption.

In addition, according to another embodiment of the invention, by appropriately designing the capacitance value, it is possible to effectively improve the power noise tracking capability of each circuit unit with respect to power fluctuation.

Figure 7:
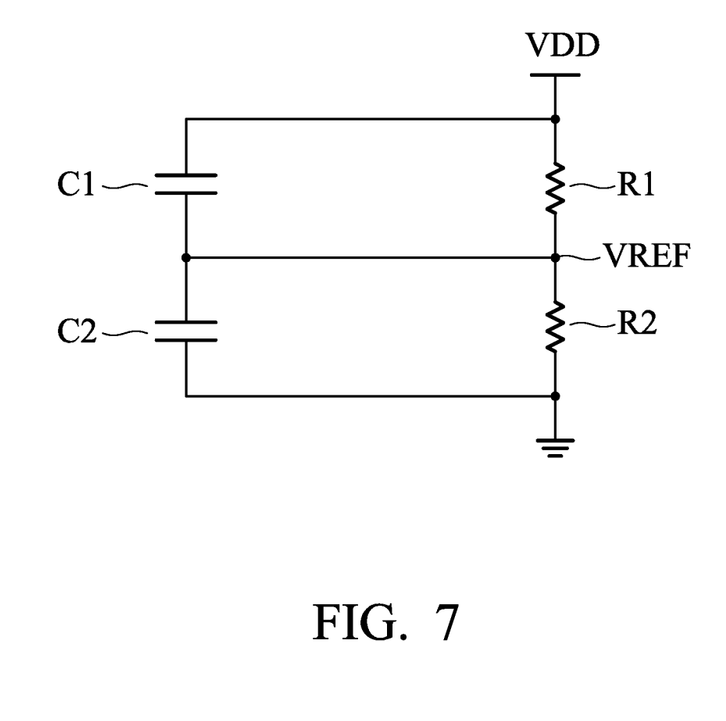
FIG. 7 is a schematic diagram showing an exemplary design of the capacitors and resistors in a reference voltage generating circuit according to an embodiment of the invention.

FIG. 7 is a schematic diagram showing an exemplary design of the capacitors and resistors in a reference voltage generating circuit according to an embodiment of the invention. The resistor R1 represents the equivalent resistance of a circuit unit from the system high voltage VDD to the output terminal of the reference voltage VREF. The resistor R2 represents the equivalent resistance of the circuit unit from the output terminal of the reference voltage VREF to the ground terminal GND. The capacitor C1 represents the equivalent capacitance of the circuit unit from the system high voltage VDD to the output terminal of the reference voltage VREF. Capacitor C2 represents the equivalent capacitance of the circuit unit from the output terminal of the reference voltage VREF to the ground. The relationship between the reference voltage VREF, the resistance R1 and R2, and the capacitors C1 and C2 can be derived as follows:

$$VREF = VDD * \{[R2*(1+S*R1*C1)]/[R1+R2+S*R1*R2*(C1+C2)]\} \quad \text{Eq. (1)}$$

$$\text{Pole } W_p = \{[R1+R2]/[R1*R2*(C1+C2)]\} \quad \text{Eq. (2)}$$

$$\text{Zero } W_z = 1/(R1*C1) \quad \text{Eq. (3)}$$

wherein S=jw, w is the angular frequency, w=2πf, and f is the frequency.

By designing the circuit based on the equations illustrated above, add appropriate capacitors into the reference voltage generating circuit, each circuit unit can effectively follow possible changes of the system high voltage, in a wider frequency range. Thereby, the power noise tracking capability of each circuit unit can be improved.

Figure 8:
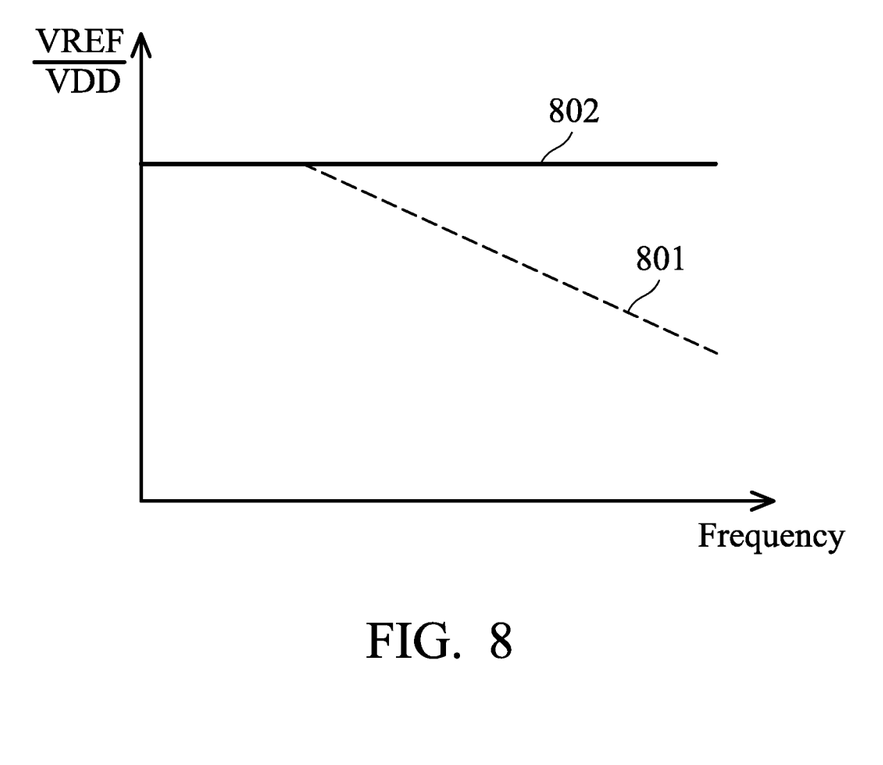
FIG. 8 is a diagram showing the relationship between the ratio of the reference voltage VREF and the power supply voltage VDD and the frequency according to an embodiment of the invention.

FIG. 8 is a diagram showing the relationship between the ratio of the reference voltage VREF and the system high voltage VDD, and the frequency according to an embodiment of the invention. The line 801 shows the result obtained in the conventional design, and the line 802 shows the result obtained by designing a reference voltage generating circuit according to an embodiment of the invention. It can be clearly seen from the figure that the voltage ratio of the reference voltage VREF and the system high voltage VDD does not change as the frequency increases, and can maintain a constant value, which representing that the power noise tracking capability has been effectively improved.

The embodiments of the present invention can be implemented in any of numerous ways. For example, the embodiments may be implemented using hardware, software or a combination thereof. It should be appreciated that any component or collection of components that perform the functions described above can be generically considered as one or more controllers that control the function discussed above. The one or more controllers can be implemented in numerous ways, such as with dedicated hardware, or with general-purpose hardware that is programmed using microcode or software to perform the functions recited above.

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. A controller, comprising:
   an input/output circuit, comprising a plurality of receiving circuits, wherein each of the plurality of receiving circuits receives and processes a data bit and generates an output bit accordingly;
   a reference voltage generating circuit, comprising a plurality of circuit units, coupled to the input/output circuit, to provide a plurality of reference voltages;
   a logic circuit, coupled to the reference voltage generating circuit for controlling operations of the plurality of circuit units, wherein each of the plurality of circuit units is controlled independently, such that the reference voltage generating circuit generates the plurality of reference voltages having a plurality of voltage levels; and
   a monitoring circuit, coupled to the input/output circuit, for monitoring the output bit generated by each of the plurality of receiving circuits in a voltage calibration procedure,
   wherein one of the plurality of circuit units is coupled to one of the plurality of receiving circuits to provide one of the plurality of reference voltages to the corresponding one of the plurality of receiving circuits, and the one of the plurality of receiving circuits processes the data bit according to the one of the plurality of reference voltages,
   wherein in the voltage calibration procedure, the monitoring circuit monitors content of the output bit generated by each of the plurality of receiving circuits according to the plurality of reference voltages having the plurality of voltage levels, so as to determine an optimum voltage level for each of the plurality of receiving circuits by judging whether a number of data bits received by the receiving circuit is maximum.

2. The controller as claimed in claim 1, wherein the voltage calibration procedure comprises: the logic circuit controls each of the plurality of circuit units to adjust the voltage level of each of the plurality of reference voltages.

3. The controller as claimed in claim 1, wherein the logic circuit further controls each of the plurality of circuit units according to the corresponding optimum voltage level, so as to set the voltage level of each of the plurality of reference voltages generated by each of the plurality of circuit units as the corresponding optimum voltage level.

4. The controller as claimed in claim 1, wherein the controller is a DDR memory controller.

5. The controller as claimed in claim 1, wherein the reference voltage generating circuit further comprises a main circuit and a plurality of sub-circuits, the main circuit is coupled to the plurality of sub-circuits, each of the plurality of circuit units is formed by the main circuit and one of the plurality of sub-circuits, the main circuit is coupled to a system high voltage and a ground voltage, configured to generate a first voltage and a second voltage according to the system high voltage and the ground voltage and provide the first voltage and the second voltage to the sub-circuits, each sub-circuit is configured to generate the corresponding reference voltage according to the first voltage and the second voltage, and the first voltage is higher than the second voltage.

6. The controller as claimed in claim 1, wherein a number of the receiving circuits and a number of the circuit units correspond to a number of the channel(s).

7. A method for generating reference voltages, suitable for a controller, wherein the controller comprises an input/output circuit and a reference voltage generating circuit, the input/output circuit comprises a plurality of receiving circuits configured to receive and process a plurality of data bits and the reference voltage generating circuit comprises a plurality of circuit units, the method comprising:

providing a reference voltage to a corresponding one of the plurality of receiving circuits by each of the plurality of circuit units; and processing one of the plurality of data bits by each of the plurality of receiving circuits according to the corresponding reference voltage to generate an output bit, wherein the method further comprises:

controlling each of the plurality of circuit units to adjust a voltage level of the reference voltage, such that the plurality of circuit units outputs the reference voltages with a plurality of voltage levels in a voltage calibration procedure, sequentially providing the reference voltages with the plurality of voltage levels to the corresponding plurality of receiving circuits;

providing predetermined data to the input/output circuit and monitoring content of the output bit generated by each of the plurality of receiving circuits by receiving and processing the predetermined data according to the reference voltages having the plurality of voltage levels, so as to determine an optimum voltage level for each of the plurality of receiving circuits by judging whether a number of data bits received by the receiving circuit is maximum.

8. The method as claimed in claim 7, wherein the controller is a DDR memory controller.

9. The method as claimed in claim 7, further comprising:
controlling operation of each of the plurality of circuit units independently, such that the reference voltage generating circuit generates the reference voltages having the plurality of voltage levels.

10. The method as claimed in claim 7, wherein the optimum voltage level is a voltage level of the reference voltage for each of the plurality of receiving circuits having a maximum operating range.

11. The method as claimed in claim 7, wherein the optimum voltage level is the voltage level of the reference voltage for each of the plurality of receiving circuits having a minimum error rate.

12. The method as claimed in claim 7, further comprising:
controlling each of the plurality of circuit units according to the optimum voltage level, so as to set the voltage level of the reference voltage provided by each of the plurality of circuit units as the corresponding optimum voltage level.

13. The method as claimed in claim 7, further comprising:
generating a first voltage and a second voltage according to a system high voltage and a ground voltage by each of the plurality of circuit units; and generating the reference voltage according to the first voltage and the second voltage by each of the plurality of circuit units, wherein the first voltage is higher than the second voltage.

14. The method as claimed in claim 7, wherein a number of the receiving circuits and a number of the circuit units correspond to a number of the channel(s).

\* \* \* \* \*